US011855660B2

(12) United States Patent
Maccioni et al.

(10) Patent No.: US 11,855,660 B2
(45) Date of Patent: Dec. 26, 2023

(54) SIGMA-DELTA ANALOG-TO-DIGITAL CONVERTER AND SENSOR ARRANGEMENTS INCLUDING THE SAME

(71) Applicant: Sciosense B.V., AE Eindhoven (NL)

(72) Inventors: Alberto Maccioni, La Spezia (IT); Monica Schipani, Pisa (IT); Massimiliano Franzolin, Pontedera (IT); Fabrizio Mannozzi, Vezzano Ligure (IT)

(73) Assignee: Sciosense B.V., AE Eindhoven (NL)

( * ) Notice: Subject to any disclaimer, the term of this patent is extended or adjusted under 35 U.S.C. 154(b) by 313 days.

(21) Appl. No.: 17/294,903

(22) PCT Filed: Nov. 26, 2019

(86) PCT No.: PCT/EP2019/082611
§ 371 (c)(1),
(2) Date: May 18, 2021

(87) PCT Pub. No.: WO2020/109320
PCT Pub. Date: Jun. 4, 2020

(65) Prior Publication Data
US 2021/0409036 A1 Dec. 30, 2021

(30) Foreign Application Priority Data
Nov. 27, 2018 (EP) .................................. 18208673

(51) Int. Cl.
*H03M 3/00* (2006.01)
*G01K 7/34* (2006.01)
(52) U.S. Cl.
CPC .............. *H03M 3/474* (2013.01); *G01K 7/34* (2013.01); *H03M 3/49* (2013.01)
(58) Field of Classification Search
CPC ........... H03M 3/474; H03M 3/49; G01K 7/34
(Continued)

(56) References Cited

U.S. PATENT DOCUMENTS 6,498,573 B2* 12/2002 Laaser .................... H03M 3/32
341/143
6,888,358 B2* 5/2005 Lechner .................. H03M 3/35
324/444

(Continued)

FOREIGN PATENT DOCUMENTS

EP        3546956 B1     10/2019

OTHER PUBLICATIONS

Wei et al., "Systematic Methodology for Designing Reconfigurable ΔΣ Modulator Topologies for Multimode Communications Systems," Conference: Proceedings of the Conference on Design, Automation and Test in Europe, Munich, Germany, Mar. 6-10, 2006, 6 pages.

(Continued)

*Primary Examiner* — Khai M Nguyen
(74) *Attorney, Agent, or Firm* — Slater Matsil, LLP

(57) ABSTRACT

In an embodiment, an ADC converter includes a first injection branch and a second injection branch, a first feedback branch and a second feedback branch, an integration node connected to the first and second injection branches and the first and second feedback branches, an integrator connected to the integration node and a comparator connected downstream of the integrator and configured to generate a comparator output signal to control the first and second feedback branches, wherein the first and second injection branches are configured to provide a charge injection dependent on a respective input quantity to the integration node, wherein the input quantity of the first injection branch is selected from a differential voltage signal, a capacitance dependent signal and a current dependent signal, wherein the input quantity of the second injection branch is selected from another one of the differential voltage signal, the capacitance dependent signal and the current dependent signal, and wherein the first and second feedback branches are configured to provide a (Continued)

feedback charge injection dependent on the comparator output signal to the integration node, the first and second feedback branches configured to receive one of a fixed voltage signal or a differential voltage signal.

19 Claims, 14 Drawing Sheets

(58) Field of Classification Search
USPC .......................................... 341/141, 143, 155
See application file for complete search history.

(56) References Cited

U.S. PATENT DOCUMENTS

| | | |
|---|---|---|
| 8,217,815 B2 | 7/2012 | Chen et al. |
| 9,509,332 B1 | 11/2016 | Garrity et al. |
| 2003/0090277 A1 | 5/2003 | Lechner et al. |
| 2008/0129570 A1 | 6/2008 | Lim et al. |
| 2010/0208114 A1 | 8/2010 | Kwon et al. |

OTHER PUBLICATIONS

Nairn, D.G., "Algorithmic Analogue-to-Digital Convertors using Current-Mode Techniques," IEEE Proceedings—G, vol. 137, Part G, No. 2, XP000102784, ISSN: 0622-0039, Stevenage, Herts,, GB, Apr. 1990, 6 pages.

* cited by examiner

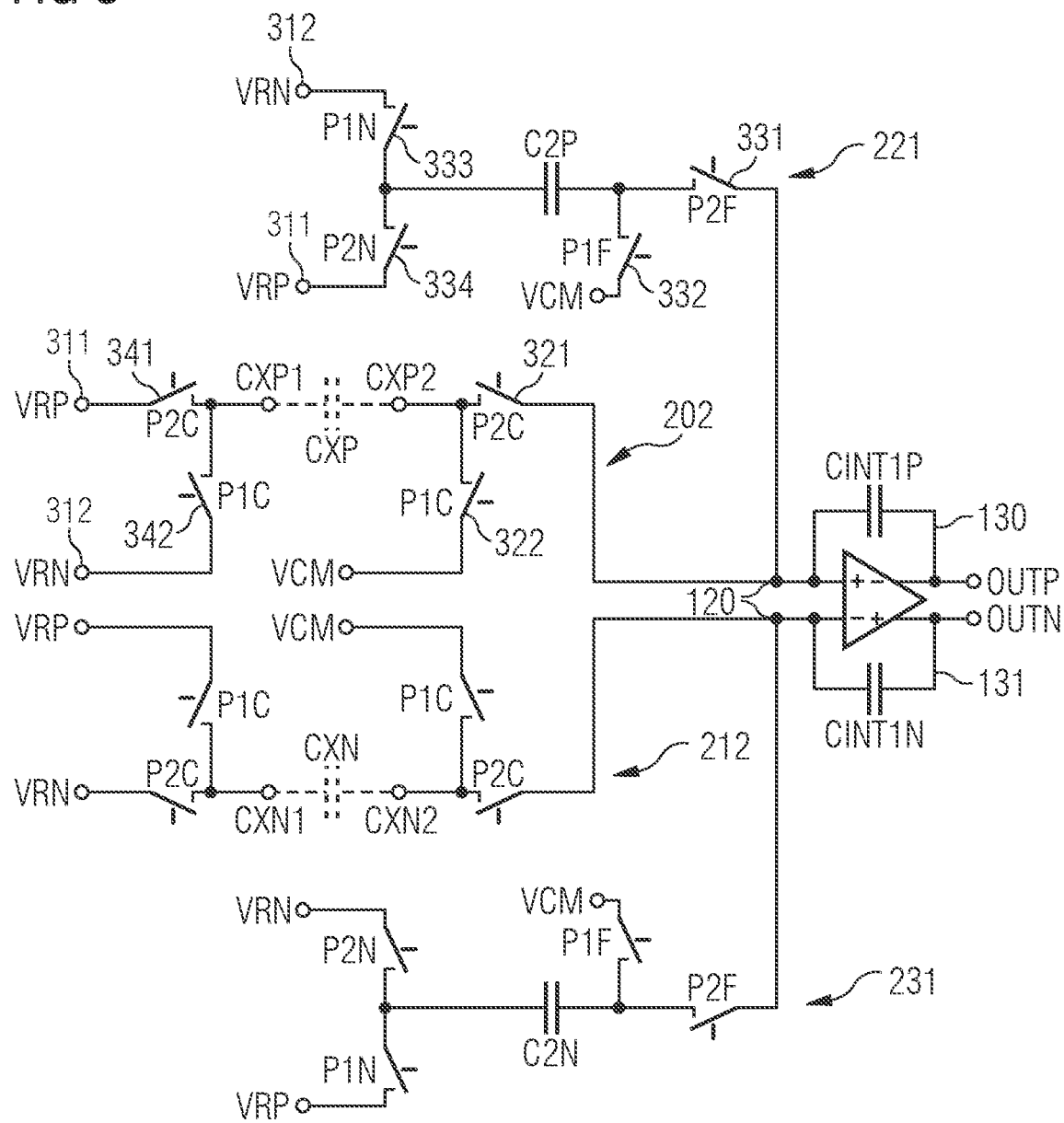

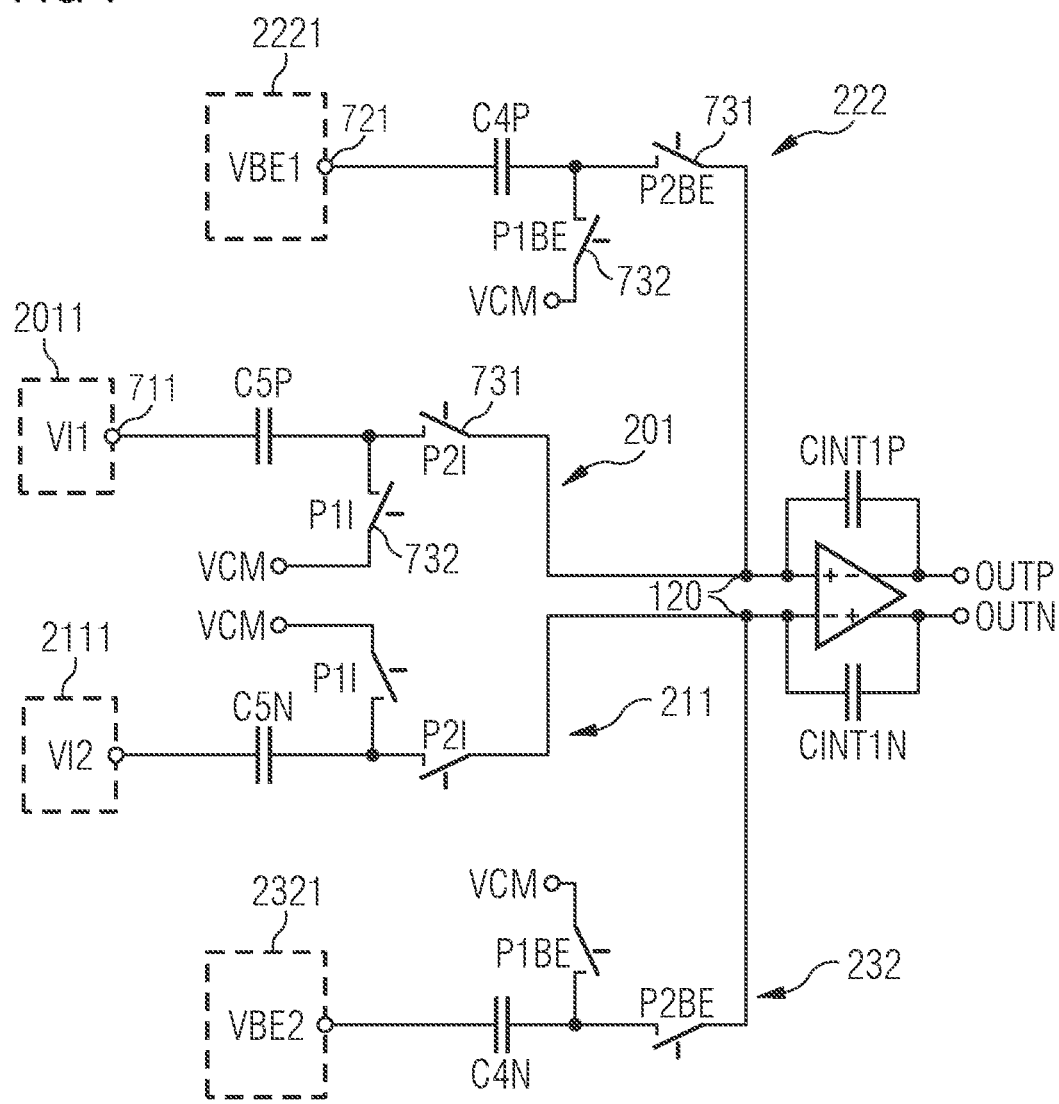

SIGMA-DELTA ANALOG-TO-DIGITAL CONVERTER AND SENSOR ARRANGEMENTS INCLUDING THE SAME

This patent application is a national phase filing under section 371 of PCT/EP2019/082611, filed Nov. 26, 2019, which claims the priority of European patent application 18208673.6, filed Nov. 27, 2018, each of which is incorporated herein by reference in its entirety.

TECHNICAL FIELD

The present disclosure relates to a sigma-delta analog-to-digital converter. Specifically, the present disclosure concerns a sigma-delta analog-to-digital converter that includes multiple injection and feedback branches to process two or more different input quantities. The present disclosure also relates to a sensor arrangement that comprises a sigma-delta analog-to-digital converter connected to a sensor element and a multi-mode sensor arrangement including a sigma-delta analog-to-digital converter connected to first and second sensor elements.

BACKGROUND

Analog-to-digital converters (ADCs) are widely used in electronic devices to convert an analog signal into a digital signal. The analog signal may be provided by an analog signal source such as a sensor device or other analog signal sources. The generated digital signal may be further processed by digital signal processing means such as a micro processor. The input signal may exhibit different input quantities such as a voltage signal, a capacitance dependent signal, a current dependent signal and others in differential or single ended form.

An analog-to-digital converter according to the sigma-delta working principle is often used to convert a signal from a sensor element to a digital value. The sigma-delta ADC operating principle is to have a charge injection dependent on the input quantity to be measured or converted and a feedback charge injection dependent on the bitstream generated by the sigma-delta ADC conversion. As a variety of sensors is available to measure a variety of quantities, for example, ohmic resistance, temperature, humidity, ambient light and other quantities, the sigma-delta ADC can be dedicated to acquire a variety of different quantities. The conversion from input quantity to charge to be treated by the ADC requires different circuits for different types of input quantity. As electronic devices such as smartphone devices, home automation devices, electronic devices in the automotive industry or in industry applications tend to receive more and more input quantities to control their operation, there is a need for analog-to-digital converters and specifically for sigma-delta ADCs to be able to convert different input quantities into the digital domain.

Conventionally, a sigma-delta ADC that works with one kind of input quantity cannot work with another input quantity, since the input circuit to receive the electrical signal from the to-be-converted quantity is dedicated to that quantity. Conventionally, several input circuits may convert different input quantities to voltages that may be multiplexed to provide them to a sigma-delta ADC. Another conventional solution may use separate sigma-delta ADCs, each tailored to the specific input quantity to be converted. Accordingly, conventional approaches may use either separate ADCs for each to be converted input quantity or the same ADC with different analog frontends dedicated to the specific input quantity that produce a corresponding voltage connected to a multiplexer in front of the ADC. This requires considerable surface area to realize the ADC in an integrated circuit and considerable power or current consumption when operating the device.

SUMMARY

Embodiments provide a sigma-delta analog-to-digital converter that is able to process input signals from multiple different input quantities with reduced circuit expense.

Further embodiments provide a sigma-delta analog-to-digital converter that is able to process signals from a variety of different input quantities that requires less integrated circuit semiconductor area and consumes less operating power.

Yet other embodiments provide sensor arrangements using such a sigma-delta analog-to-digital converter.

A sigma-delta ADC comprises a first and a second injection branch configured to receive a different input quantity and to provide a corresponding charge injection into an integration node of the ADC. Two or more injection branches are possible. One of the injection branches can treat a voltage signal such as a differential voltage signal, a voltage signal depending on the value of a variable capacitance or a voltage signal depending on a variable current or a voltage signal depending on another input quantity that generates a signal depending from a physical entity. The other one of the injection branches receives a voltage signal of one of the above-mentioned input quantities, however, the one and the other one injection branches receive input signals from different input quantities, not the same input quantity. Each of the injection branches generates a charge injection to the integration node that depends on the corresponding input signal.

The sigma-delta ADC comprises further a first feedback branch and a second feedback branch. Two or more feedback branches are possible. Each of the injection branches can be combined with one of the feedback branches to establish an ADC configuration. Each feedback branch provides a feedback charge injection into the integration node that depends on the bitstream generated by the sigma-delta ADC. The feedback injection is chosen with a polarity to make the feedback loop stable. One of the feedback branches may receive a fixed voltage signal. Another one of the feedback branches may be configured to receive a differential voltage signal from a corresponding signal generating device. The sigma-delta ADC may be configured to perform a differential conversion process so that it comprises positive injection branches and negative injection branches. The negative injection branch has a mirror symmetric structure when compared to the corresponding positive injection branch. In the same way, the feedback branches include positive branches and negative branches of mirror symmetric circuit structure. For a single ended conversion process the sigma-delta ADC includes only one type of injection and feedback branches, either only positive or only negative.

According to an embodiment, the sigma-delta ADC may be configured to convert at least two input quantities such as a capacitance dependent input and a differential voltage input that is divided by a differential voltage so that the ADC comprises a combination of a capacitance dependent input configuration and a differential voltage divided by a differential voltage configuration. In practice, the differential voltage may be a differential base emitter voltage of a bipolar transistor so that the differential voltage input is divided by $\Delta VBE$ with VBE being the base emitter voltage of a bipolar transistor. In this configuration, the temperature dependence that generates a corresponding base emitter voltage is combined with the differential input voltage automatically during the analog-to-digital conversion.

For the combination of capacitance dependent input configuration and differential voltage divided by ΔVBE configuration, the first and second injection branches and the first and second feedback branches may have the following configurations. On the injection side, the first injection branch provides a charge injection dependent on a voltage signal dependent on a variable capacitance and the second injection branch provides a charge injection dependent on a differential voltage signal. The variable capacitance is connected to the first injection branch and the differential voltage signal is input to the second injection branch. The first injection branch comprises terminals to which the capacitor of variable capacitance is connected, wherein one of said terminals is connected to a fixed voltage through respective switches. The second injection branch comprises a capacitor of fixed, known capacitance that is connected to terminals for the to be converted differential input voltage through respective switches. On the feedback side, the first feedback branch includes a capacitor connected to terminals for a fixed voltage through respective switches. The second feedback branch comprises a capacitor connected to terminals that receive a differential voltage such as ΔVBE. The combination of capacitance input configuration and differential voltage divided by ΔVBE configuration will be used to convert an analog input signal dependent on a variable capacitance with the same integrator as the differential voltage input signal. The feedback branches provide two different functions such as a fixed voltage feedback and a differential voltage feedback such as a ΔVBE feedback. Basically, any differential voltage ΔV feedback is possible.

According to the sigma-delta ADC working principle, a comparator is connected downstream of the integrator and generates an output signal in that the integrator output is compared to a comparator threshold. The comparator output signal controls the feedback branches of the sigma-delta ADC.

According to embodiments, the differential voltage feedback branch may comprise at least two current paths that carry alternating currents. Each current path includes a corresponding impedance element to which a terminal is connected that provides a differential voltage. The differential voltage is established in time division. This means that, at a first instance, a first voltage signal is provided and, at a second following time instance, another voltage is provided thereby establishing a differential voltage at two consecutive time instances.

According to embodiments, the first and second current paths carrying alternating currents can be realized with first and second current sources connected to a cross-switch arrangement in order to cross connect the first and second current paths, thereby generating alternating currents in the first and second current paths. The cross-switch arrangement is controlled in dependence on the comparator output signal.

According to embodiments, the impedance elements in the first and second current paths may be base emitter paths of bipolar transistors. The terminal for the differential voltage connected to one of the emitters of the transistors provides a base emitter voltage resulting from the alternating currents applied to the base emitter paths.

According to embodiments, the first and second injection branches of the combination of capacitance and differential voltage divided ΔVBE configurations includes a first switch to connect the capacitors of the respective injection branches to the integration node and a second switch to connect said capacitor to a terminal for a common mode voltage. The first and second switches are configured to operate alternately. The control signals to operate the switches are generated by a phase generator that receives the output signal from the comparator and causes the alternating switching signals. The respective capacitor may be the capacitor of variable capacitance of the first injection branch or the capacitor of fixed capacitance of the second injection branch. The common mode voltage may be a voltage substantially in the middle between the supply voltage potentials.

According to embodiments, the first and second feedback branches each include a switch to connect a capacitor of fixed capacitance of the respective branch to the integration node and a fourth switch to connect said capacitor to a terminal for the common mode voltage. The third and fourth switches are configured to operate alternately.

According to embodiments detailing the first injection branch for the capacitance dependent input signal, the first injection branch includes a fifth switch to connect the capacitor of variable capacitance to one of the terminals for the fixed voltage. The first injection branch further includes a sixth switch to connect said capacitor to another one of the terminals for the fixed voltage. The fifth and sixth switches are configured to operate alternately.

According to embodiments further detailing the second injection branch for the differential voltage input, the second injection branch includes a seventh switch to connect the capacitor of fixed capacitance to one of the terminals for the differential input voltage and includes an eighth switch to connect the capacitor of fixed capacitance to another one of the terminals for the differential input voltage. The seventh and eighth switches are configured to operate alternately.

The sigma-delta ADC concept also provides for ADC structures that include other combinations of configurations than the combination described above. For example, the sigma-delta ADC can be configured for a differential voltage input configuration in combination with another configuration. According to the differential voltage input configuration one of at least two first and second injection branches is configured to provide a charge injection dependent on a differential voltage signal. The other one of the at least two first and second injection branches is configured to provide another charge injection dependent on another input quantity. As another example, the sigma-delta ADC can be configured for a differential voltage input in combination with another configuration. According to the differential voltage input configuration one of at least two first and second injection branches is configured to provide a charge injection dependent on differential voltage signal. The other one of the at least two first and second injection branches is configured to provide another charge injection dependent on another input quantity.

Other configurations that may be combined with any other of the herein described configurations are described below. A configuration that may be combined with any other of the herein described configurations concerns a current-to-voltage configuration. According to embodiments, one of the first and second injection branches is configured to provide a charge injection that depends on a current dependent signal. The current dependent signal, in the form of a current of variable current strength, is converted into a differential voltage and input to the one of the first and second injection branches. Said injection branch comprises a capacitor of fixed capacitance that is connected to the terminal for the current dependent signal. The feedback branch comprises a capacitor connected to terminals for a fixed voltage through respective switches that are configured to operate alternately.

Another configuration that may be combined with any other of the herein described configurations concerns a current to voltage divided by a differential voltage configuration. According to embodiments, one of the first and second injection branches is configured to provide a charge injection dependent on a current dependent signal. A capacitor of fixed capacitance in said injection branch is connected to the terminal for the current dependent signal. The second feedback branch comprises a capacitor that is connected to a terminal for a differential voltage that may be a differential base emitter voltage of a bipolar transistor or a differential voltage generated by another impedance element.

One or more of the above-mentioned objects is solved by a sensor arrangement according to claim 16 or a multi-mode sensor arrangement according to claim 17.

A sensor arrangement may comprise a sensor element that generates a voltage signal dependent on an ambient condition. The ambient condition may be one of temperature, gas concentration, humidity, ambient light and other physical conditions. In an embodiment, the sensor element may be a gas sensor based on a metal oxide element that is operated at elevated temperature so that the metal oxide element is disposed on a heater. The resistance of the metal oxide element depends on the gas concentration so that a differential voltage is derived from the metal oxide element and input to one of the first and second injection branches of the sigma-delta ADC. The metal oxide element may be included in a circuit that generates a differential voltage that depends on the gas concentration.

Another application of the sigma-delta ADC may be in the field of multi-mode sensor arrangements that include sensor elements to sense different physical conditions such as a first sensor element comprises a gas sensitive metal oxide sensor and another sensor element comprises a humidity sensor. The humidity sensor element includes a dielectric layer that is sensitive to ambient humidity so that it constitutes a capacitor of variable capacitance dependent on ambient humidity. A combined sensor arrangement includes a gas sensor based on a metal oxide sensor element and a humidity sensor based on a humidity-sensitive dielectric in a capacitor wherein both sensor signals may be processed through two of the injection branches of a sigma-delta ADC.

In this case, the metal oxide sensor element may be coupled to at least one of the differential input voltage terminals of the second injection branch and the humidity sensor element may provide the capacitor of variable capacitance to be connected to the corresponding terminals of the first injection branch.

A home automation device is provided according to claim 18.

The home automation device may include a communication module and the above-mentioned sensor arrangement or a multi-mode sensor arrangement. A signal from the sensor/multi-mode sensor arrangement causes an item of information to be transmitted through the communication module of the home automation device. The home automation device may be configured to operate in response to a speech reception signal. The speech signal may be interpreted by a central computer connected to the home automation device through the communication module.

It is to be understood that both the foregoing general description and the following detailed description are merely exemplary, and are intended to provide an overview or framework to understand the nature and character of the claims. The accompanying drawings are included to provide a further understanding and are incorporated in, and constitute a part of, this description. The drawings illustrate one or more embodiments, and together with the description serve to explain principles and operation of the various embodiments. The same elements in different figures of the drawings are denoted by the same reference signs.

BRIEF DESCRIPTION OF THE DRAWINGS

In the drawings.

FIG. 3 shows a circuit diagram of the capacitance dependent input configuration;

FIG. 7 shows a circuit diagram of the current dependent input divided by $\Delta VBE$ configuration;

DETAILED DESCRIPTION OF ILLUSTRATIVE EMBODIMENTS

The present disclosure will now be described more fully hereinafter with reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure.

Figure 1:
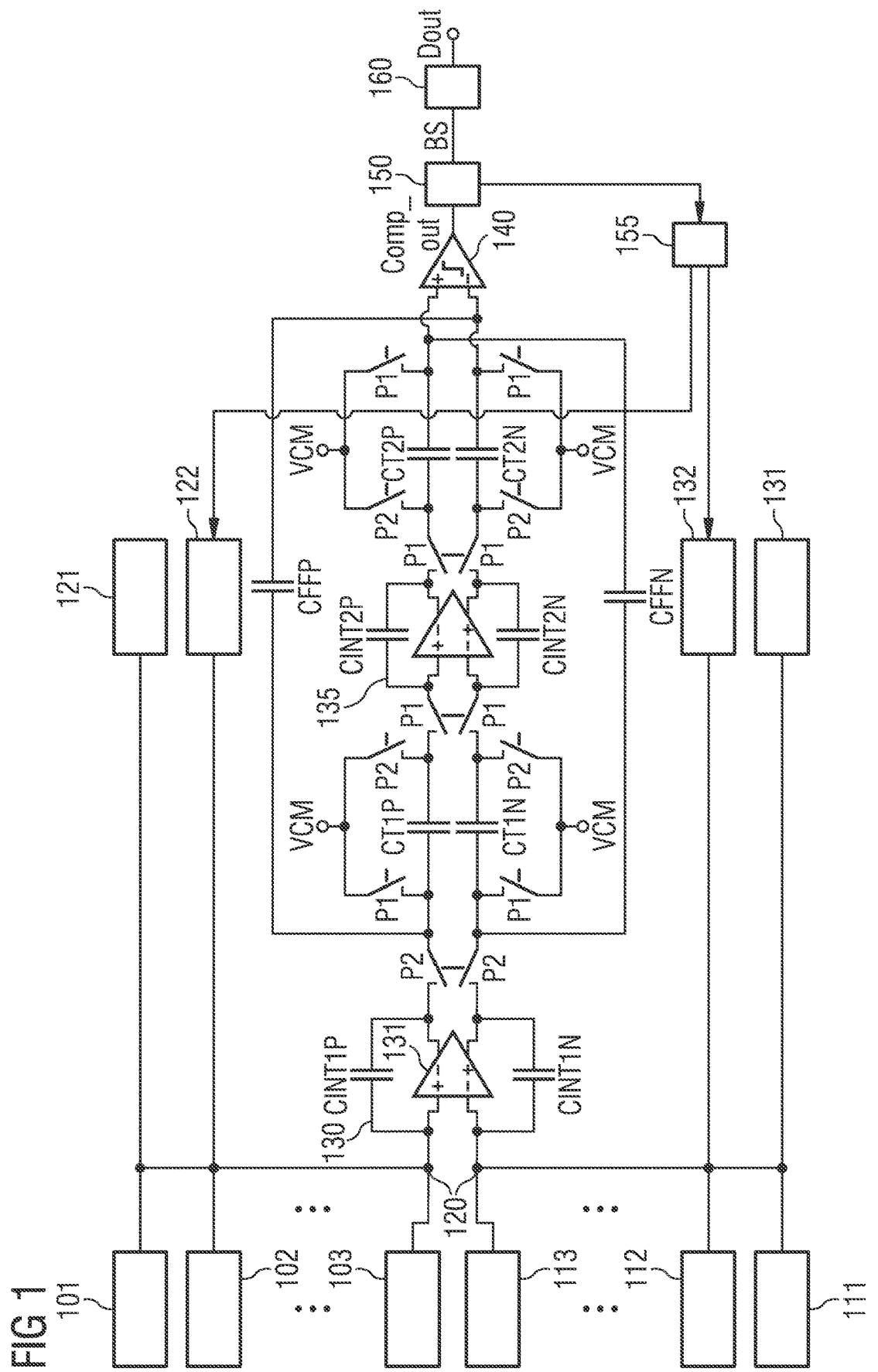
FIG. 1 show a block diagram of a sigma-delta analog-to-digital converter.

FIG. 1 illustrates a block diagram of a sigma-delta ADC. The ADC of FIG. 1 comprises several injection branches 101, 102, 103, 111, 112, 113, several feedback branches 121, 122, 131, 132, a two-stage integration core 130, 135, 140 and control and post processing circuits 150, 160, 155. The ADC is configured to operate fully differential so that the injection and feedback branches and the integration core are substantially symmetric in that it includes positive injection branches and corresponding negative injection branches and positive feedback branches and negative feedback branches, both positive and negative branches taken together establishing the differential operating mode. It is also possible to use only the positive or only the negative injection and feedback branches to perform a non-differential single ended mode. In the differential processing mode fluctuations of common mode signals are eliminated that may affect the conversion result in the single ended mode.

The ADC in FIG. 1 comprises a number of several, e.g., N injection branches connected to the integration node 120 at the input of the integrator 130. The N injection branches, of which three branches 101, 102, 103 are depicted, receive an input signal to be converted to a digital value. First and second positive feedback branches 121, 122 are connected to integration node 120, wherein the feedback branches are controlled by an output signal Comp_out available at the output of the ADC core. Correspondingly, N negative injection branches are provided such as injection branches 111, 112, 113. One of the positive injection branches has a corresponding negative injection branch to allow differential operation. Correspondingly, first and second negative feedback branches 131, 132 are provided, connected to the input node 120 and controlled by the output of the conversion core.

The core circuit includes an integrator 130 that comprises an operational amplifier 131 and an integration capacitor CINT1P connected between input and output of the operational amplifier to constitute an integrator. For the differential operational mode depicted in FIG. 1, the integrator 131 operates differentially and includes two integration capacitors CINT1P and CINT1N for the positive and the negative operational paths. The conversion core is configured as a two-stage core and includes the integrator 130 and the downstream connected second integrator 135 with capacitance and switching circuitry between the first and second integrators 130, 135. A one-stage core may also be useful, wherein the two-stage conversion core may achieve the same resolution as the one-stage core at a shorter integration time.

A comparator 140 is provided downstream of the second stage integrator 135 and compares the output of the integrator with a threshold voltage provided by the comparator. Comparator 140 is configured as a differentially working comparator. The output of the comparator carries the comparator output signal Comp_out that is forwarded to a phase generator 150 that generates a bitstream signal BS and generates control signals to control the operation of switches in the injection and feedback branches. The bitstream BS comprises a sequence of ones and zeros wherein the relation between the ones and zeros is representative of the analog value to be converted. Furthermore, a block 155 generating a time division differential voltage is controlled by the phase generator 150. The time division differential voltage is forwarded to feedback branches 122 and 132. A post processing block 160 is connected downstream to the phase generator 150. Block 160 may be a low pass filter that converts the bitstream BS to a digital word Dout that can be processed by a microprocessor or other digital processing circuitry.

Each injection branch receives an analog input signal that belongs to a different input quantity such as a differential voltage signal, a capacitance dependent signal, a current dependent signal or a differential current dependent signal. At least two injection branches are selected out of the presented N injection branches and are supplied with input signals of different input quantity. Not selected injection branches may be omitted. In the single ended case, at least two positive injection branches are present, in the differential operating case, also at least two negative injection branches corresponding to the positive injection branches are present. One or more feedback branches are selected depending on the feedback operation needed such as a fixed voltage feedback or a differential voltage feedback. Not selected feedback branches may be omitted. The selected injection and feedback branches are directly connected to the integration node 120 either in single ended or differential fashion. With the selection of at least two injection branches of different input quantity and one or more feedback branches, different analog input quantities can be converted from the analog to the digital domain using the same conversion core during subsequent AD conversion processes that convert the different input quantities one after the other. The injection and feedback branches are connected to the integration node, avoiding multiplexing circuitry so that the sigma-delta converter concept shown in FIG. 1 saves components and space when realized as an integrated circuit and supply power during its operation. The circuit in FIG. 1 allows the analog-to-digital conversion of different input quantities to a digital signal at reduced expense.

Figure 2:
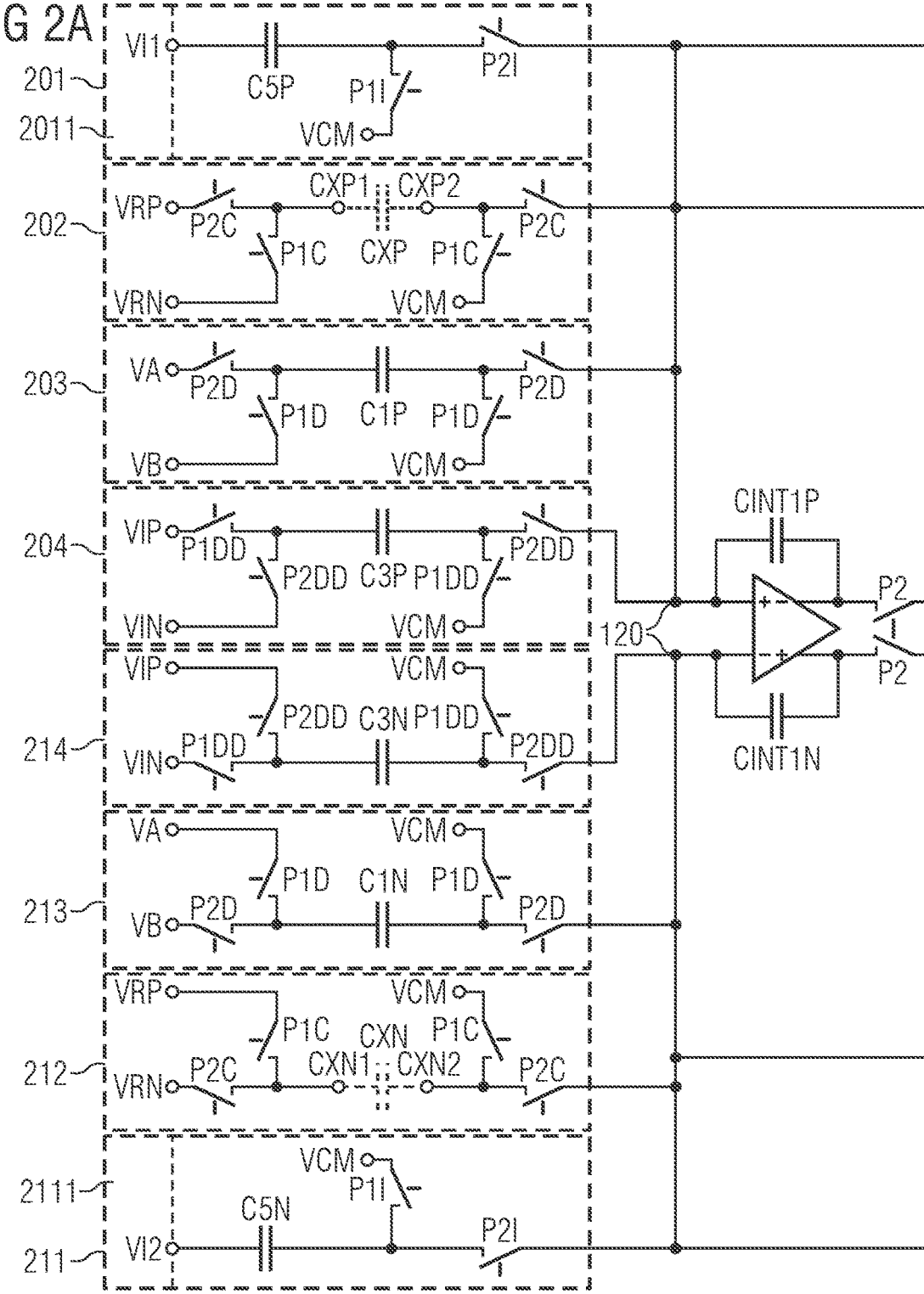
FIG. 2 shows a detailed circuit diagram of the sigma-delta analog-to-digital converter of FIG. 1.
Figure 2B:
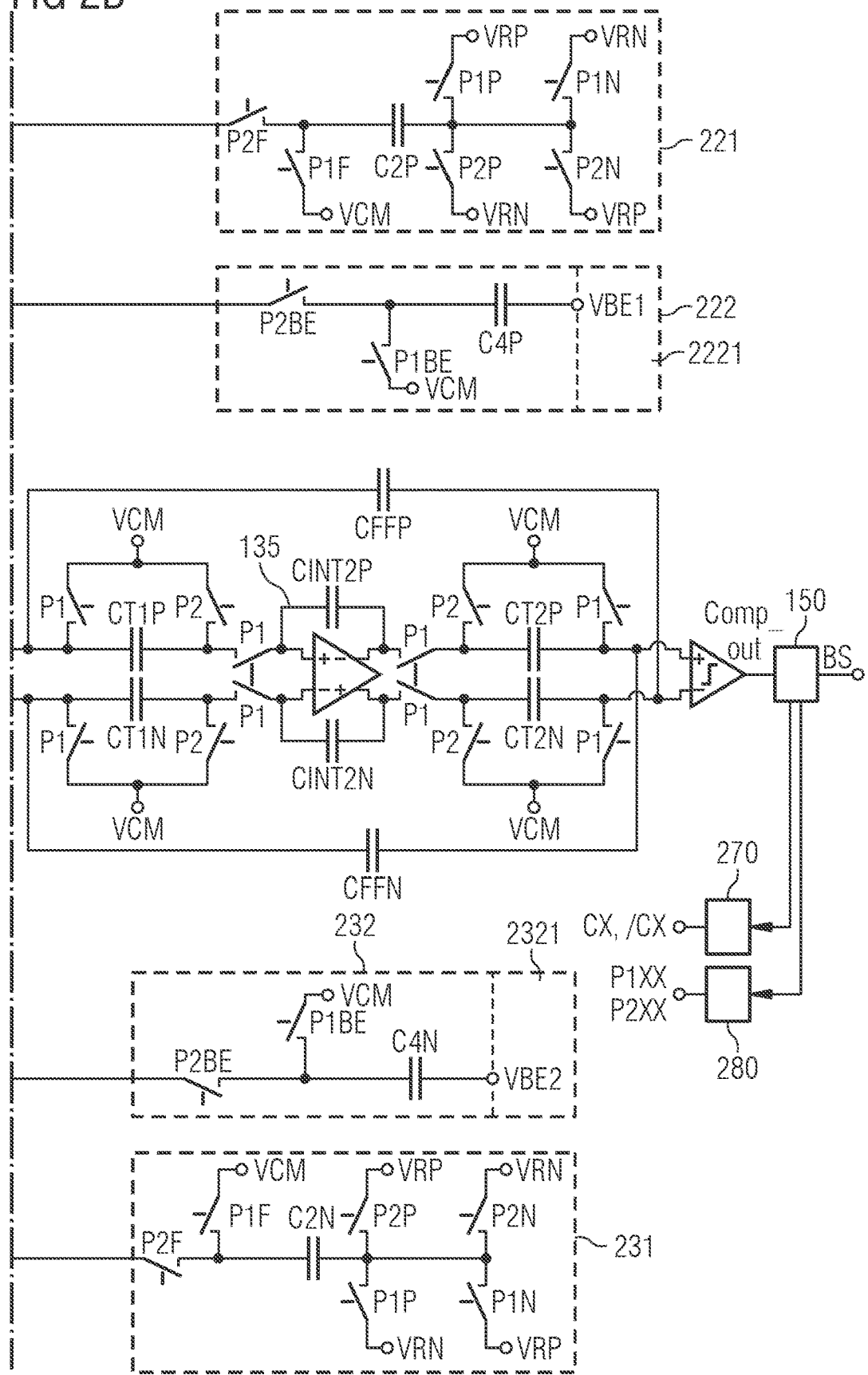

The circuit blocks shown in FIG. 1 may be realized on the circuit level as shown in FIG. 2. Input branches 201, 202, 203, 204 are each configured to receive a different input quantity. Input branches 214, 213, 212 and 211 correspond to input branches 201, 202, 203, 204 to establish differential mode operation. On the feedback side, feedback branches 221, 222 correspond to feedback branches 231, 232 to allow differential mode feedback operation. The upper and the lower half of the injection branches and the feedback branches are symmetric along a central horizontal axis. FIG. 2 shows all available types of injection and feedback branches. At least two of the injection branches are selected supplied by different input quantities. Depending on the conversion needs, one or more of the feedback branches are selected. Not selected ones of the branches shown in FIGS. 1 and 2 are omitted. Several conceivable configurations are explained in connection with FIGS. 4 through 7.

In more detail, injection branches 201 and 211 relate to a current dependent input signal VI1, VI2. Injection branches 201, 211 are the positive and the corresponding negative injection branch for the current dependent input signal to establish a differential conversion operation. Only one of the positive and negative branches is sufficient for a single ended conversion mode. Positive and negative injection branches 202 and 212 relate to a capacitance dependent input signal represented by variable capacitances CXP and CXN. Positive and negative injection branches 203 and 213 relate to a differential voltage input signal VA, VB, wherein the differential voltage is established between VA and VB, VA-VB. Positive and negative injection branches 204 and 214 correspond to another differential voltage input that may include a different capacitor for a different input signal range. The differential input voltage for injection branches 204, 214 is VTP-VIN. The feedback branches relate to a fixed voltage feedback performed by positive and negative feedback branches 221 and 231. A differential voltage feedback is enabled by positive and negative feedback branches 222, 232. For the differential voltage feedback, the feedback branches 222, 232 include a differential voltage generator 2221, 2321 that generates a differential voltage VBE1 in time multiplex and another differential voltage VBE2 also in time multiplex. The differential voltage generators 2221 and 2321 are each controlled by control signals CX, /CX generated in control block 270 controlled by phase generator 150.

The current dependent input signal to injection branches 201, 211 is made by a current-to-voltage generator 2011 that generates a time division differential voltage VI1 dependent on a variable input current I and another current voltage converter 2111 that generates a time division differential voltage VI2 dependent on the input current. The current-to-voltage generators 2011, 2111 are each controlled by control signals CY, /CY derived from the clock signal CLK so that signals CY, /CY have clock type character modified from signal CLK to avoid overlap. Circuit block 280 generates phase control signals such as P1, P2, P1C, P2C, P1D, P2D, P1DD, P2DD, P1F, P2F, P1I, P2I, P1N, P2N, P1P, P2P, P1BE, P2BE, in general P1XX, P2XX, that control the switches used in the conversion core and in the injection and feedback branches. Block 280 is connected downstream the phase generator 150.

FIGS. 3 through 7 show combinations of injection and feedback branches to establish a specific operational configuration that is able to convert a specific input quantity to a digital signal. From all the available injection and feedback branches shown in FIG. 2, a combination of two or more of those configurations from FIGS. 3 through 7 may be combined to establish a converter that is able to convert two different input quantities with the same conversion core.

FIG. 3 shows a configuration to convert a signal dependent from a variable capacitance to a digital output signal. The variable capacitance CXP is connected to terminals CXP1, CXP2. The capacitor CXP may change its capacitance value with, e.g., humidity or pressure. For example, the dielectric may be a dielectric changing with humidity so that the capacitance of capacitor CXP changes accordingly. Input injection branch 202 is connected to fixed voltages VRP, VRN at terminals 311, 312. The potentials VRN, VRP are negative and positive reference potentials that may be, in practice, ground potential GND for potential VRN and a positive reference potential for VRP, that may be a potential close to the positive supply potential VDD.

Capacitor CXP is connected through switches 341, 342 to the terminals 311, 312 for potentials VRP, VRN. Switches 341, 342 are controlled by control signals P2C, P1C. Switches 341, 342 are controlled alternately so that switch 341 is closed when switch 342 is open and vice versa. Accordingly, the control signals P2C, P1C have non-overlapping pulses that may be shifted by 180°. Terminal CXP2 of variable capacitor CXP is coupled to integration node 120 through switch 321. Terminal CXP2 is also connected to a common mode voltage VCM through switch 322. Switches 321, 322 are operated alternately so that they are controlled by control signals P2C, P1C having non-overlapping pulses.

The feedback branch 221 includes a capacitor C2P of fixed capacitance which is connected through switches 333 and 334 to the fixed voltage potentials VRN, VRP at terminals 312, 311. Switches 333, 334 are operated alternately by control signals P1N, P2N. Capacitor C2P is connected to integration node 120 through switch 331 controlled by control signal P2F. Capacitor C2P is furthermore connected to common mode voltage VCM through switch 332 controlled by control signal P1F. Control signals P1F, P2F have non-overlapping pulses shifted by 180°.

Injection and feedback branches 202, 221 are positive branches. For differential mode operation, corresponding negative branches 212, 231 are provided that have a symmetric structure so that the input signal orientation is inverted while the circuit structure is identical. The fixed potentials VRN, VRP in the positive injection and feedback branches 202, 221 are exchanged with the other potential VRP, VRN in the negative injection and feedback branches 212, 231.

Figure 9:
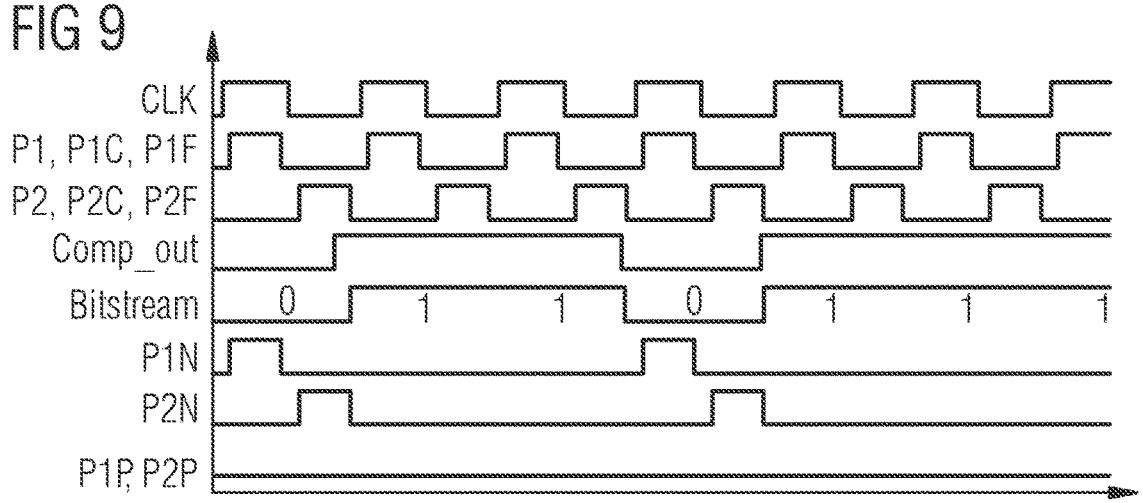
FIG. 9 shows a wave form diagram of the capacitance dependent input configuration.

The wave forms of the signals present in FIG. 3 are depicted in the wave form diagram of FIG. 9. Control signals P1N, P2N in the feedback branch are generated in response to the comparator output signal Comp_out through phase generator 150 and control signal generating block 280 (FIG. 2). Control signals P1C, P2C, P1F, P2F are continuously running clock signals derived from the system clock CLK. The capacitance mode operates only in unipolar input range mode so that the feedback has only a unipolar orientation and the control signals P1P, P2P of the feedback branch 221 shown in FIG. 2 are not operative in the configuration shown in FIG. 3. Accordingly, these switches are not shown in FIG. 3.

Figure 4:
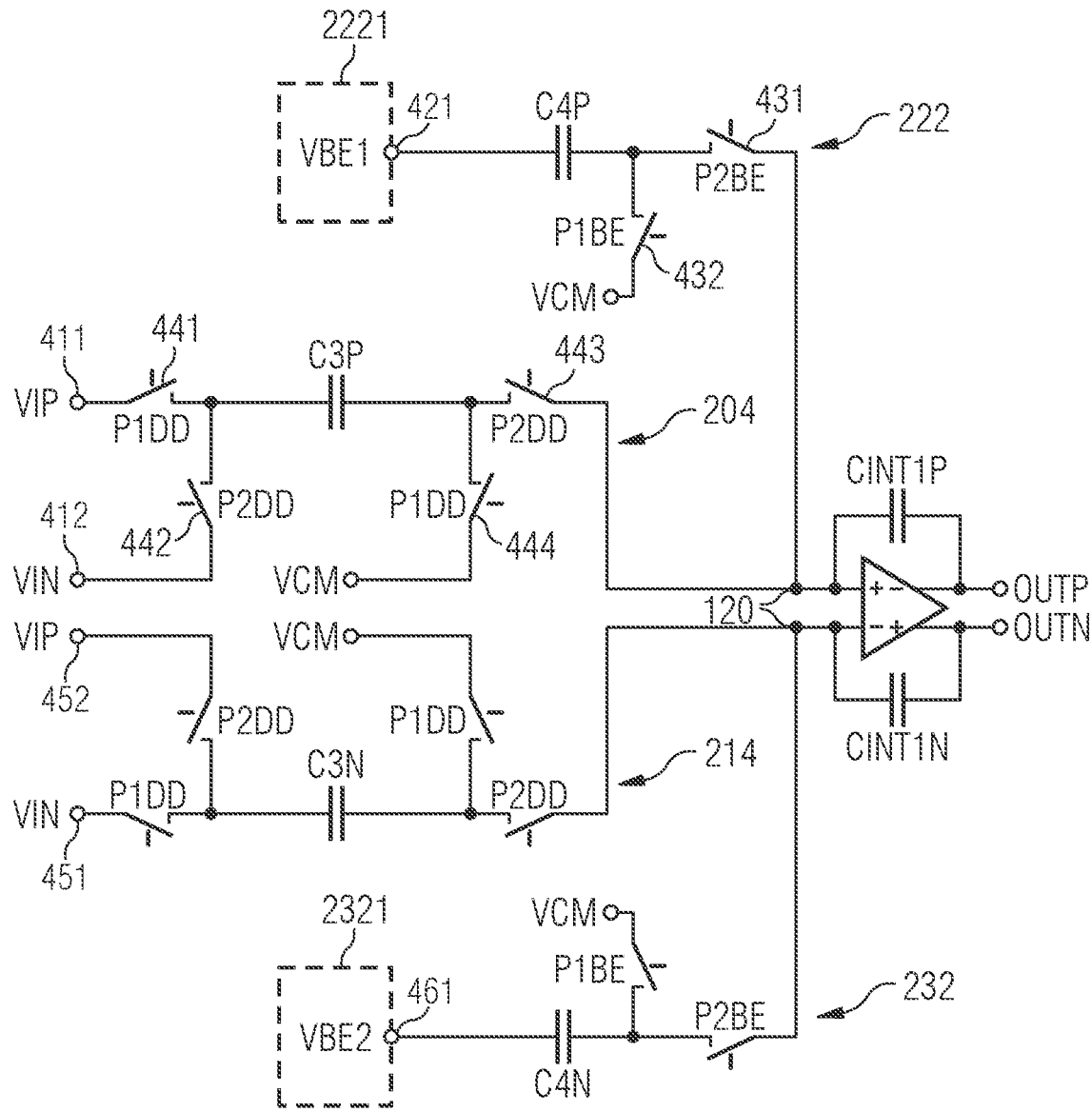
FIG. 4 shows a circuit diagram of the differential voltage divided by $\Delta VBE$ configuration.

Turning now to FIG. 4, the configuration of differential voltage input VIP minus VTN divided by ΔVBE is shown. The configuration in FIG. 4 uses the positive injection branch 204 and the positive feedback branch 222 connected to integration node 120. For differential mode operation, the negative injection branch 214 and the negative feedback branch 232 are also provided and connected to the differential terminals of the integration node 120. In more detail, the positive injection branch 204 includes a capacitor C3P of fixed capacitance which is connected to the differential input voltage terminals 411, 412 carrying the differential input voltage VIP-VTN through switches 441, 442. Switches 441, 442 are operated alternately and are controlled by control signals P1DD, P2DD. The other terminal of capacitor C3P is connected to integration node 120 by switch 443. Capacitor C2P is also connected to the common mode voltage VCM through switch 444. Switches 443, 444 are operated alternately and controlled by control signals P2DD, P1DD.

Figure 8A:
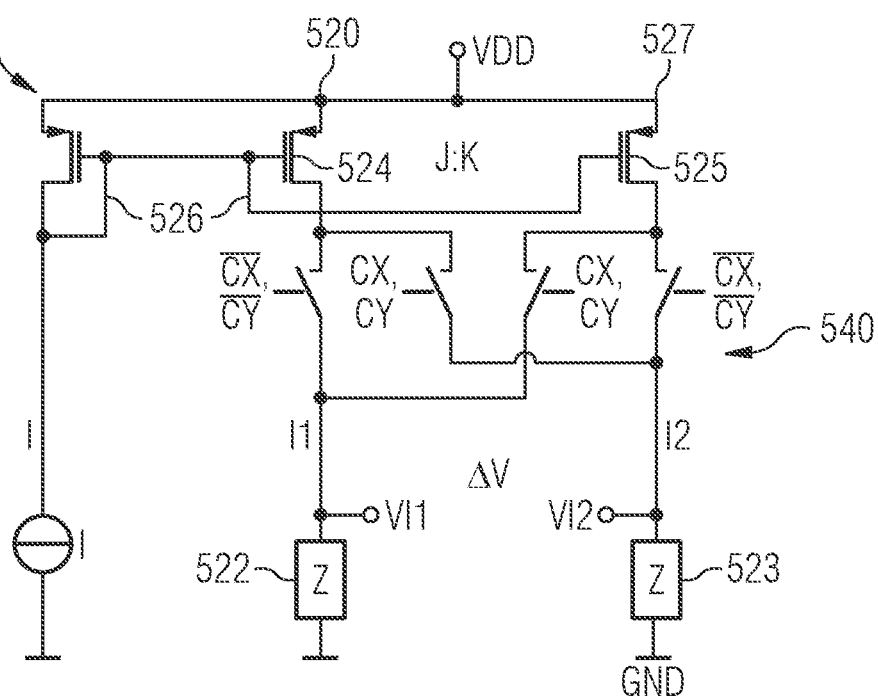
FIGS. 8A and 8B show current-to-voltage converters to be used in at least some of the circuits of FIGS. 1 through 7.
Figure 8B:
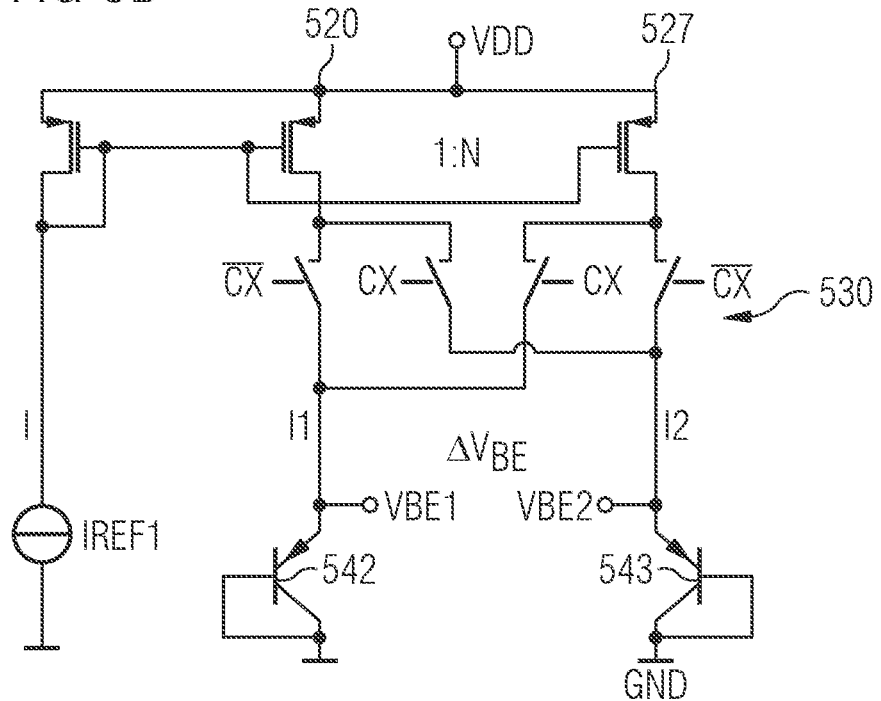

The feedback path includes a capacitor C4P connected to integration node 120 through switch 431 and connected to common mode voltage VCM through switch 432. Switches 431, 432 operate alternately controlled by control signals P2BE, P1BE. The other terminal of capacitor C4P is connected to a terminal 421 which receives a time multiplex differential voltage VBE1. Differential voltage VBE1 may be provided by a circuit 2221 as shown in FIG. 8B described below. The function of the circuit in FIG. 4 is to convert the differential voltage VIP-VTN to the digital domain and thereby divide it by ΔVBE which eliminates the dependency included in the voltage ΔVBE. Provided that the voltage ΔVBE is generated by a pn-connection such as the base emitter junction of a bipolar diode as shown in FIG. 8B, the temperature dependency of VTP-VIN is eliminated from the output signal. The negative injection and feedback branches 214, 232 have the same structure as the positive branches 204, 222 with the exception that the input terminals for the differential voltage 451, 452 carry the inverted differential voltage that is that terminal 451 is connected to potential VIN and terminal 452 is connected to potential VIP. In the negative feedback branch 232, the terminal 461 for the differential voltage is connected to the inverted differential voltage VBE2 generated by the circuit 2321 in FIG. 8B. In general, instead of the base emitter voltage of a bipolar transistor, a differential voltage having a different impedance behavior can be used so that the voltage to be forwarded to terminals 421, 461 may be derived from any impedance element Z as shown in the circuit of FIG. 8A to be explained below. Impedance element Z may exhibit a non-linear current to voltage characteristic.

Figure 10A:
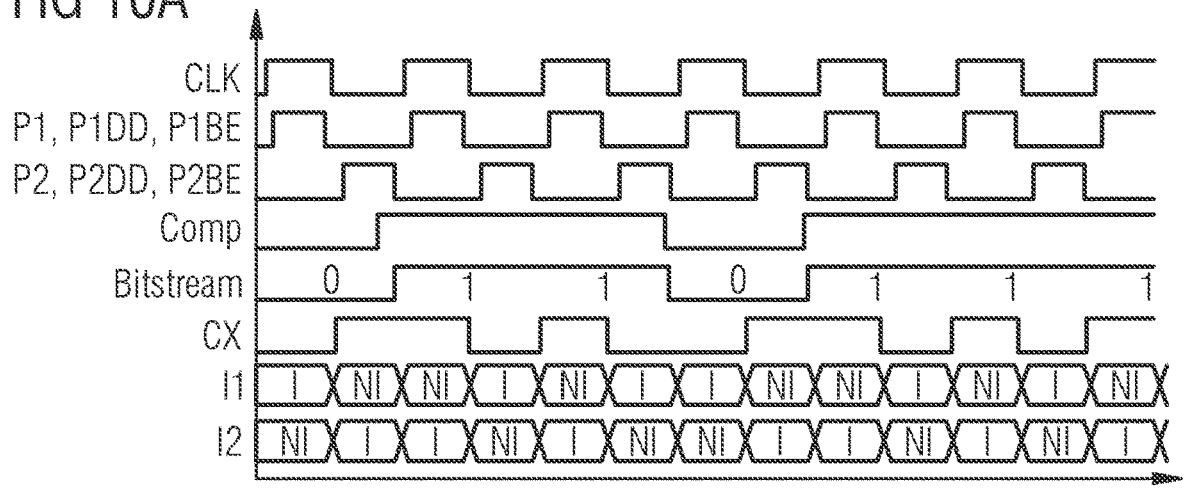
FIGS. 10A and 10B show wave form diagrams of the differential voltage divided by $\Delta VBE$ configuration for bipolar and unipolar input range.
Figure 10B:
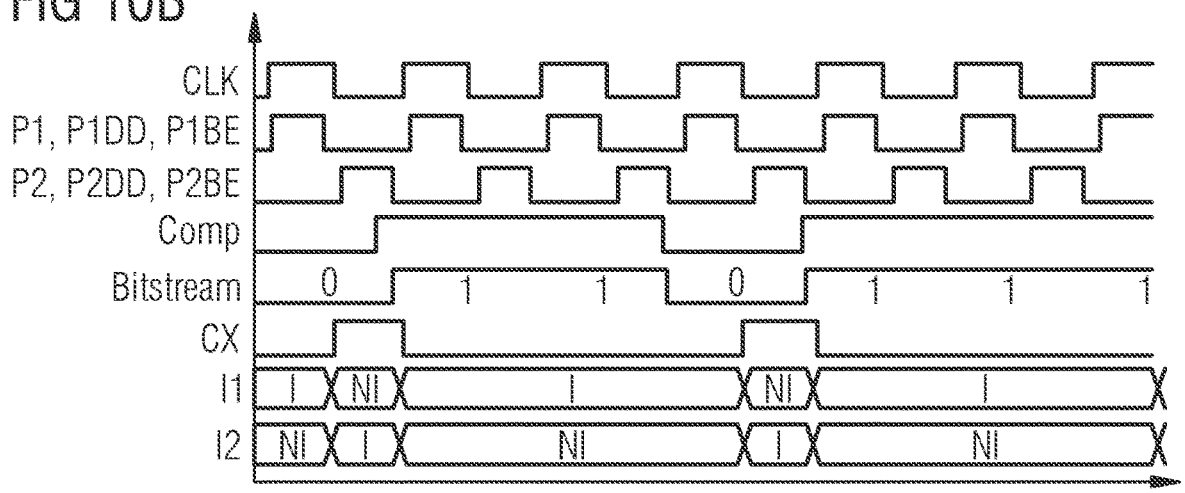

A wave form diagram of the signals used in the configuration shown in FIG. 4 is depicted in FIGS. 10A, 10B. FIG.

10A represents the signals used for a unipolar input range. In this case the comparator output signal controls whether the feedback injection is stopped or not. This gives a unipolar transform function that is useful for input ranges from zero to an upper limit. The unipolar mode is shown in FIG. 10A. FIG. 10B shows the wave forms for the bipolar input range, wherein the comparator output controls whether the feedback injection is positive or negative. This gives a bipolar transfer function, that is, that the input range is from a negative limit to a positive limit.

The sigma-delta ADC concept of FIGS. 1 and 2 can be configured such that the capacitance dependent signal configuration of FIG. 3 and the differential voltage divided by ΔVBE configuration of FIG. 4 are both selected, wherein the corresponding injection and feedback branches are connected to the integration node 120 to obtain a sigma-delta ADC converter that is able to convert input signals of different quantity to a corresponding digital output signal.

Figure 5:
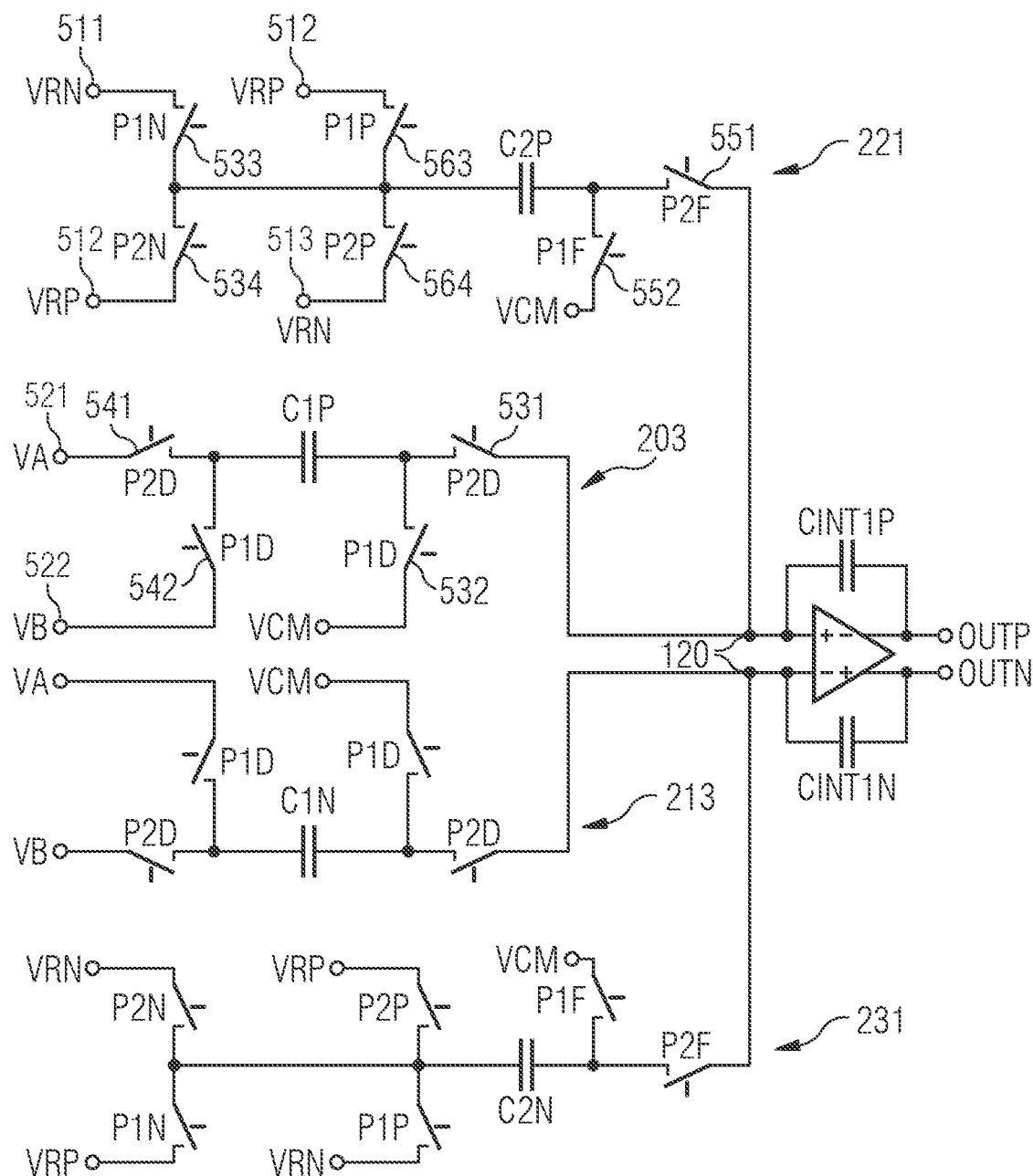
FIG. 5 shows a circuit diagram of the differential voltage input configuration.

Turning now to FIG. 5, a differential voltage input configuration is shown. The differential voltage input configuration comprises positive injection branch 203 and positive feedback branch 221. For differential operating mode, the negative injection branch 213 and negative feedback branch 231 are also connected to integration node 120. The positive injection branch comprises capacitor C1P which is connected through switches 541, 542 to differential input voltage terminals 521, 522 that receive the voltage potentials VA, VB establishing therebetween differential voltage VA-VB. Switches 541, 542 operate alternately and are controlled by control signals P2D, P1D. The other terminal of capacitor C1P is connected through switch 531 to integration node 120. Capacitor C1P is also connected to common mode voltage VCM through switch 532. Switches 531, 532 are operated alternately through control signals P2D, P1D. In the feedback path, capacitor C2P is connected to the fixed voltage potentials VRN, VRP at terminals 511, 512 through corresponding switches 533, 534. Switches 533, 534 are controlled alternately through control signals P1N, P2N. Capacitor C2P is also connected through switch 551 to integration node 120 and through switch 552 to common mode voltage VCM. Switches 551, 552 operate alternately through control signals P2F, P1F. For the bipolar input range, the feedback branch 221 comprises switches 563, 564 connected to terminals 512, 511 for the fixed reference potentials VRP, VRN. Switches 563, 564 are operated alternately. For the unipolar input range, switches 563, 564 are open and not operating.

Figure 11A:
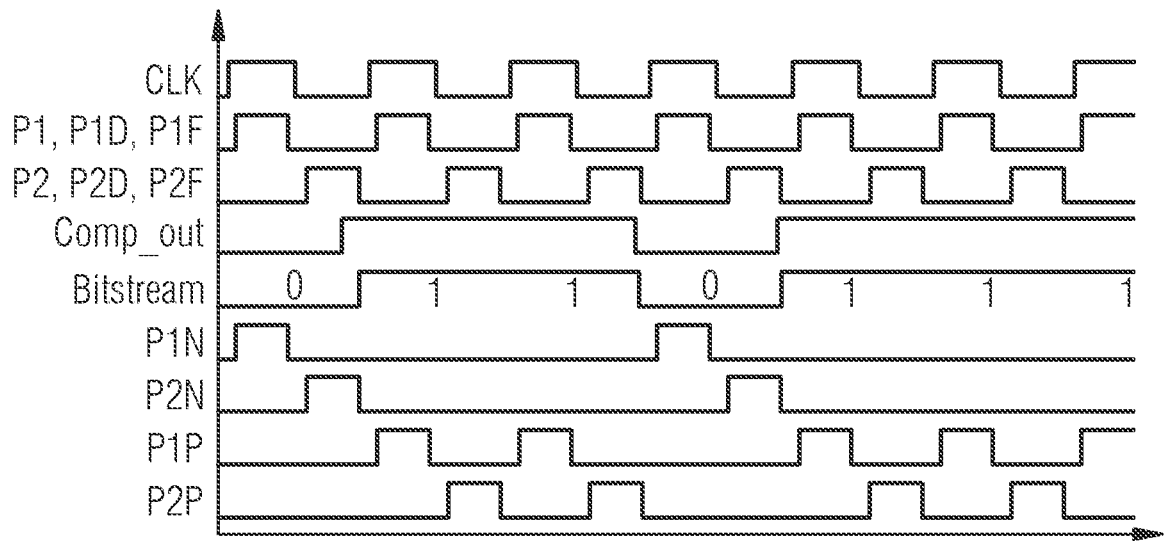
FIGS. 11A and 11B show wave form diagrams for the differential voltage input configuration for bipolar input range and unipolar input range.
Figure 11B:
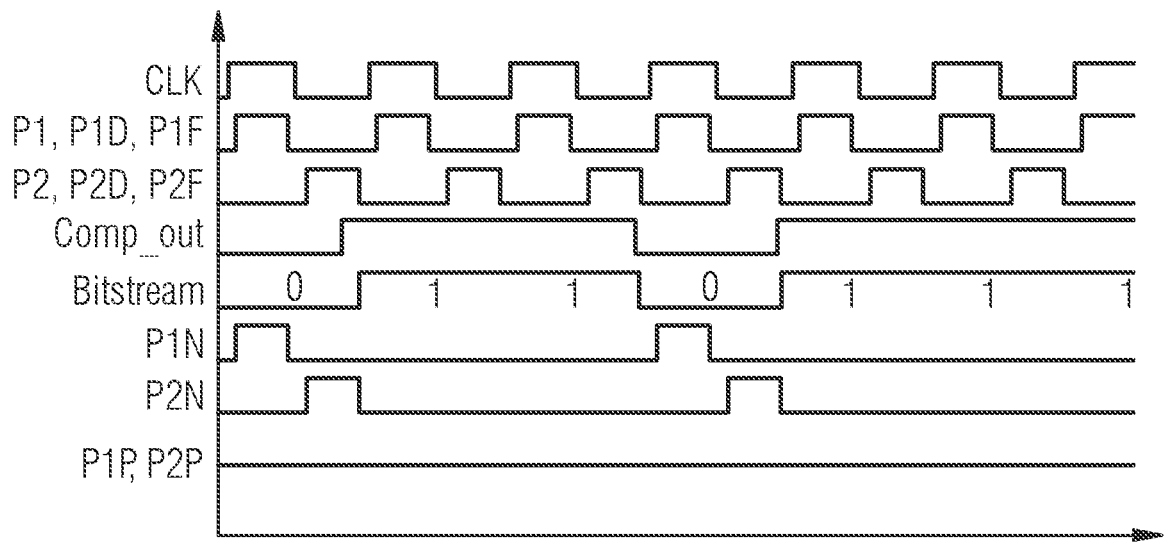

The wave form diagrams for the configuration of FIG. 5 are shown in FIGS. 11A, 11B. FIG. 11A represents the bipolar input range mode in which control signals P1P, P2P are active. FIG. 11B represents the unipolar input range mode in which control signals P1P, P2P are zero.

Figure 6:
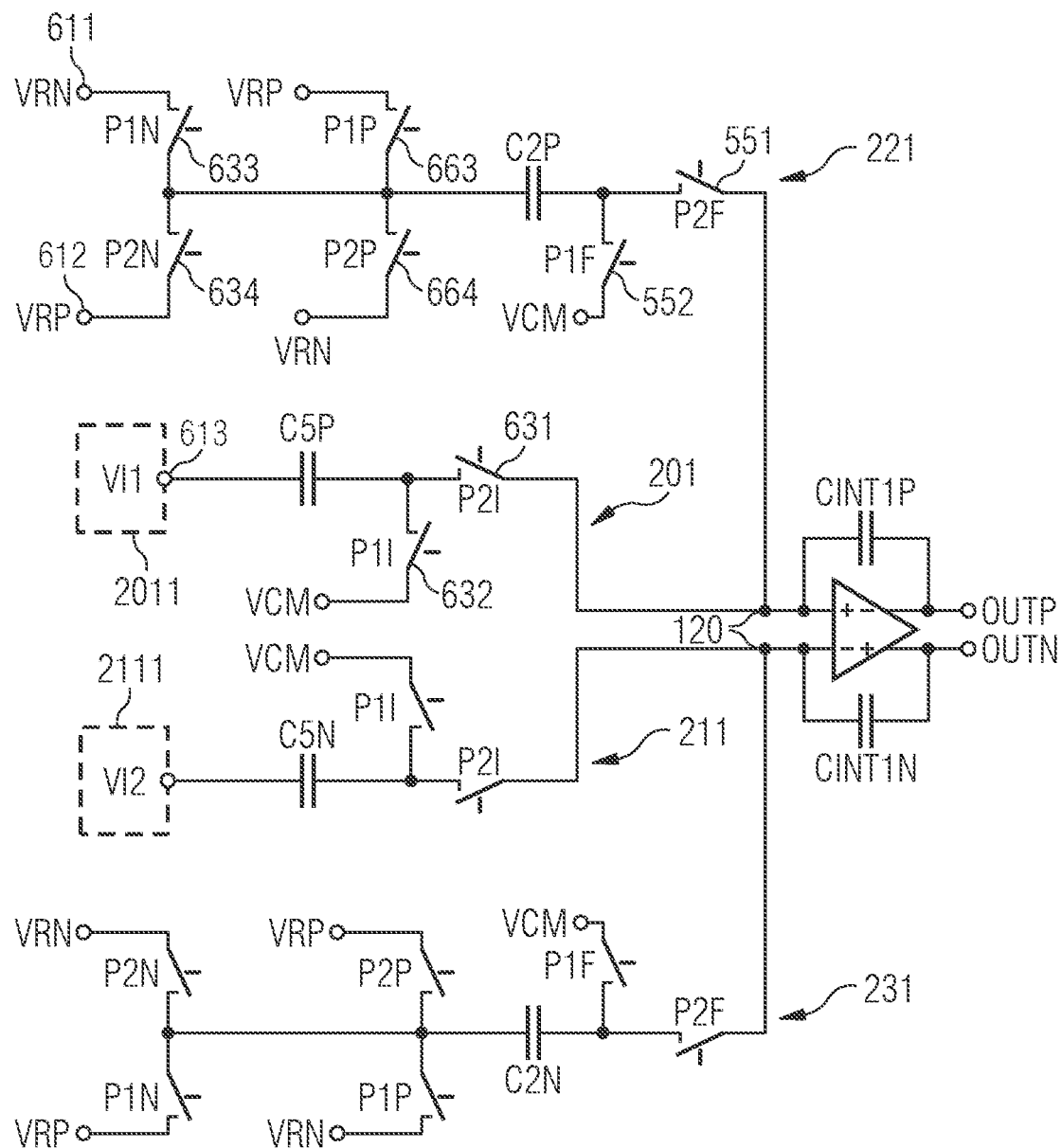
FIG. 6 shows a circuit diagram of the current dependent input configuration.

Turning now to FIG. 6, a current dependent input signal configuration is shown. The configuration of FIG. 6 comprises positive injection branch 201 and positive feedback branch 221 connected to integration node 120. For differential operating mode, the negative injection branch 211 and negative feedback branch 231 are also connected to integration node 120. A capacitor C5P is connected to a terminal 613 that receives a differential input voltage VI1 which is derived from a variable input current. The voltage VI1 is generated by the circuit 2011 shown in FIG. 8A described below. Capacitor C5P is connected to integration node 120 through a switch 631. Capacitor C5P is also connected to common mode voltage VCM through switch 632. Switches 631, 632 are operated alternately and are controlled by control signals P2I, P1I. The feedback branch 221 is the same as the feedback branch described in connection with FIG. 5.

Figure 12A:
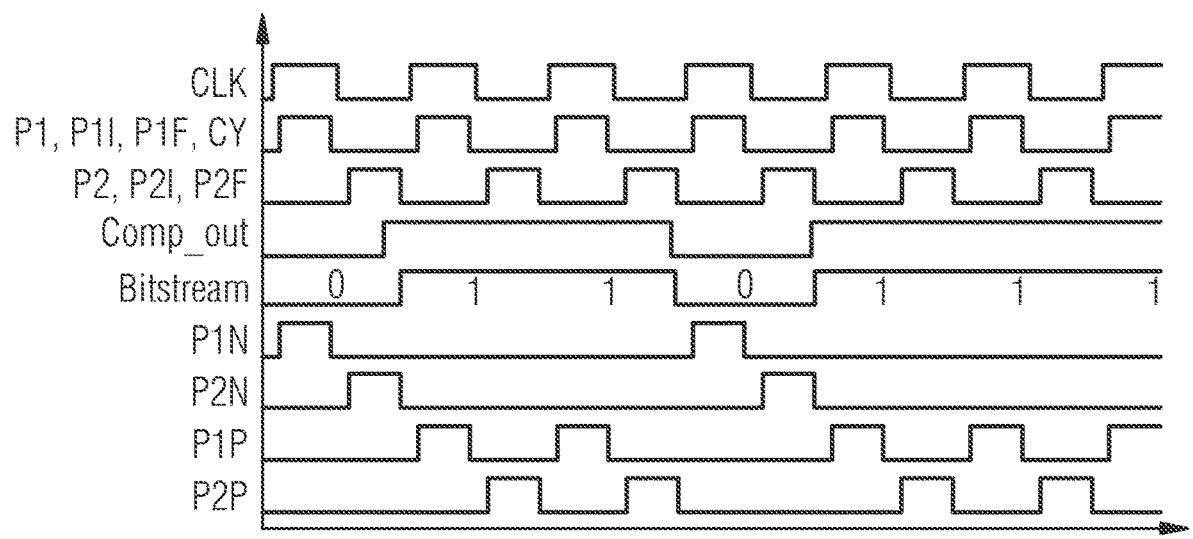
FIGS. 12A and 12B show wave form diagrams for the current dependent input configuration for bipolar input range and unipolar input range.
Figure 12B:
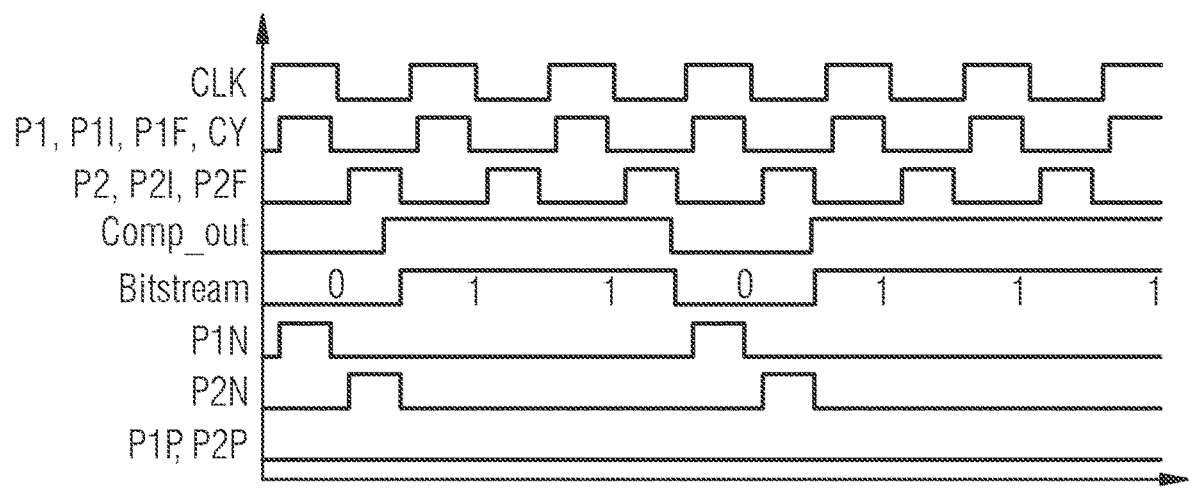

The wave forms of the signals used in FIG. 6 are depicted in FIGS. 12A, 12B, wherein FIG. 12A represents the bipolar input range mode and FIG. 12B represents the unipolar input range mode. In the bipolar input range mode, switches 633, 634, 663, 664 operate alternately in the feedback branch 221. In the unipolar input range mode, signals P1P, P2P are zero so that the corresponding switches 663, 664 are not operable.

Turning now to FIG. 7, the current dependent input signal divided by ΔVBE configuration is shown. The configuration of FIG. 7 comprises positive injection branch 201 and positive feedback branch 222 connected to integration node 120. For the differential operating mode, also the negative integration and feedback branches 211, 232 are provided and connected to differential integration node 120. Injection branch 201 is the same as the injection branch described in connection with FIG. 6. Specifically, capacitor C5P is connected to terminal 711 for the differential input voltage VIN that is generated from a variable current in accordance with the circuit shown in FIG. 8A. Capacitor C5P is connected through switch 731 to integration node 120. Capacitor C5P is also connected to common mode voltage VCM through switch 372. Switches 731, 732 are controlled by signals P2I, P1I that enable an alternating operation of said switches. Feedback branch 222 of the circuit of FIG. 7 is the same as the one described in connection with FIG. 4. Feedback branch 222 of FIG. 7 includes a capacitor C4P that is connected to terminal 721 that receives differential input voltage VBE1 generated by the circuit of FIG. 8B. Capacitor C4P is also connected through switch 731 to integration node 120 and through switch 732 to common mode voltage VCM. Switches 731, 732 are controlled by control signals P2BE, P1BE to operate alternately.

Figure 13A:
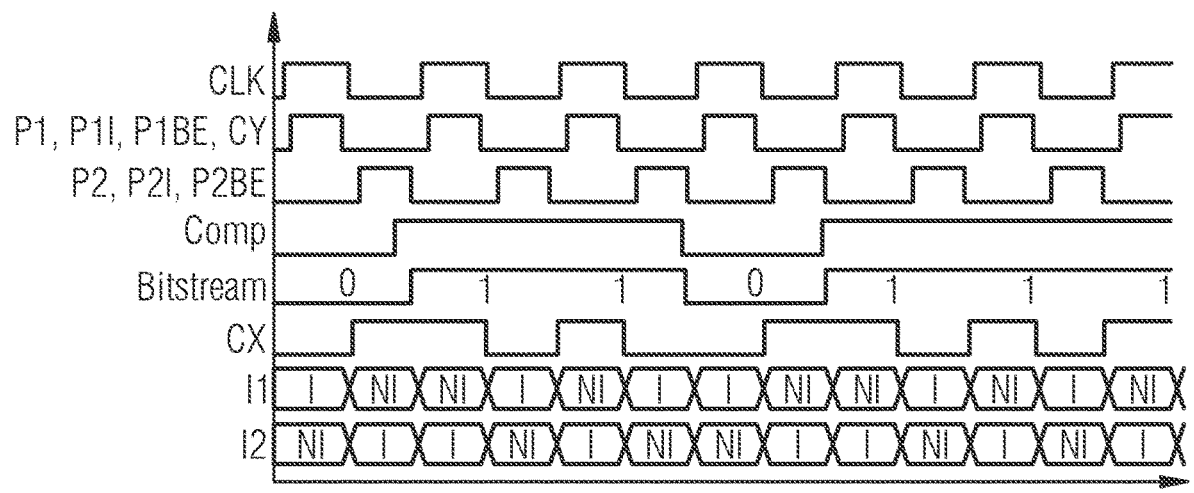
FIGS. 13A and 13B shows wave form diagrams for the current dependent input divided by $\Delta VBE$ configuration for bipolar input range and unipolar input range.
Figure 13B:
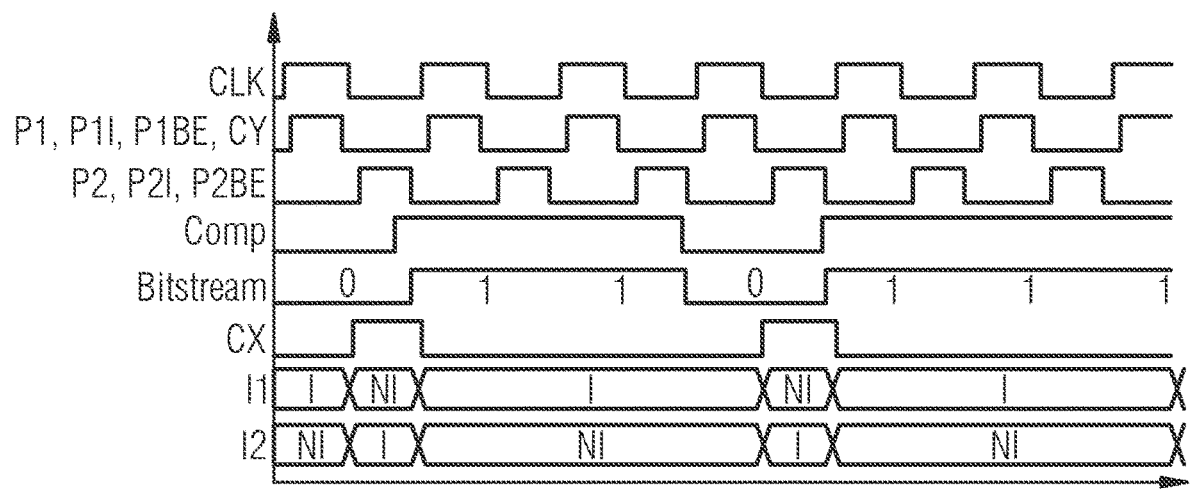

The wave form diagrams for the configuration shown in FIG. 7 are shown in FIGS. 13A and 13B, wherein FIG. 13A represents the bipolar input range mode and FIG. 13B represents the unipolar input range mode.

Turning now to FIGS. 8A and 8B, circuits 2221, 2321, 2011, 2111 are shown to generate a time division differential voltage from a current. The current may be a fixed reference current such as is shown in FIG. 8B or a variable input current such as is shown in FIG. 8A. FIG. 8A shows a circuit that generates a time division differential voltage VI1 from an input current I. The input current I may be, in general, time variable. The current I is mirrored through current mirror 526 to two current paths 520, 527. The current paths 520, 527 include current sources 524, 525 of different current strength of ration J:K. Cross switch arrangements 530, 540 cross-connect current paths 520, 527 so that the current from current source 524 is guided to current path 527 and the current from current source 525 is guided to current path 520 and vice versa. The cross switch arrangement 530 receives control signals CX, /CX generated in response to the output signal Comp_out from comparator 140 (FIG. 1). The cross switch arrangement 540 receives either control signals CX, /CX generated in response to the output signal Comp_out from comparator 140 or control signals CY, /CY as a clock type control signal derived from system clock CLK. Control signals CX, /CX are used when the circuit is connected to a feedback branch, signals CY, /CY are used when the circuit is connected to an injection branch. The currents I1, I2 through paths 520, 527 flow through impedance elements 522, 523 so that two time division voltages VI1, VI2 are generated at the impedance elements 522, 523.

The voltage VI1 depends from the input current I and may be supplied to the current signal dependent input terminals 613, 711 of the injection branch 201 in the configurations shown in FIGS. 6 and 7. For the differential operating mode, the other generated current dependent voltage VI2 is supplied to the corresponding terminals of the negative injection branch 211 of the circuits shown in FIGS. 6 and 7.

FIG. 8B shows a more specific circuit to generate a time division differential voltage based on the base emitter junction of a bipolar transistor. In FIG. 8B, the impedance elements 542, 543 are bipolar transistors of which the base and collector terminals are connected together. The current sources in paths 520, 527 have a ratio of current strength of 1:N. The current is time invariant and related to a reference current IREF1. The voltages at the emitters of transistors 542 and 543, VBE1, VBE2 are forwarded to the positive and negative injection branches 222, 232 that may be used in the configurations shown in FIGS. 4 and 7. For example, the relation between switching signals CX, /CX and currents I1, I2 may be as follows:

$$CX=1, /CX=0: I1=I, I2=N*I$$

$$CX=0, /CX=1: I1=N*I, I2=I.$$

Turning back to the circuits of FIGS. 4 and 7, the function of the feedback of ΔVBE is to provide a division by ΔVBE and eliminate the temperature dependency of the input during the analog-to-digital conversion. In the single ended operation mode, only VBE1 is forwarded to feedback branch 222. In the differential operating mode, VBE1 and VBE2 are forwarded to the feedback branches 222, 232.

Turning now to the wave form diagrams of FIGS. 10A, 10B and 13A, 13B, the operating of the currents I1, I2 of FIG. 8B are shown. In the bipolar input range mode (FIGS. 10A, 13A), the current between current paths 520, 527 is cross-switched between said paths in response to the bitstream signal. In case the bitstream is "0", a first configuration of currents I1, I2 is selected in correspondence with the P1 pulse, and a second configuration of currents I1, I2 is selected in correspondence with the P2 pulse. The first configuration comprises: I1=I and I2=N*I, and the second configuration comprises: I1=N*I and I2=I. In case the bitstream is "1", the second configuration is selected in correspondence with the P1 pulse, and the first configuration is selected in correspondence with the P2 pulse. For the unipolar input range mode (FIGS. 10B, 13B), the switching between the first and second configurations in response to the bitstream signal is as follows. In case the bitstream is "0", the first configuration is selected in correspondence with the P1 pulse, and the second configuration is selected in correspondence with the P2 pulse. In case the bitstream is "1", the first configuration is selected for the entire clock period.

Figure 14:
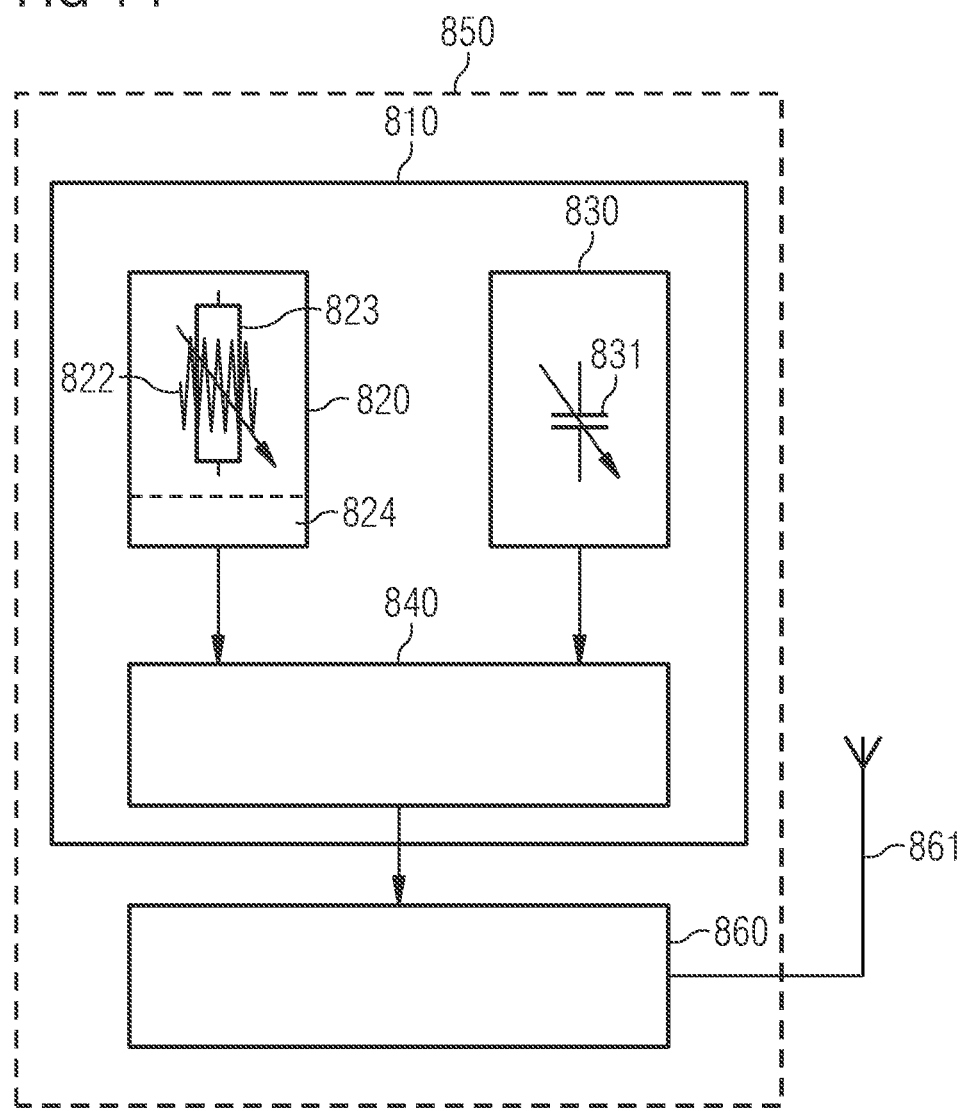
FIG. 14 shows a block diagram of a multi-mode sensor arrangement.

Turning now to FIG. 14, the application of a sigma-delta ADC in a multi-sensor arrangement is shown. The multi-sensor arrangement 810 includes at least two sensor elements 820, 830. The first sensor element 820 comprises a gas sensor based on a heated metal oxide (MOX) sheet and sensor element 830 comprises a capacitive humidity sensor. The metal oxide sheet 823 of MOX sensor element 820 varies its resistance in dependence on a gas concentration. The working point of the resistive metal oxide sheet is at elevated temperature so that a resistive heater 822 is provided in sensor element 820. The varying resistance of the metal oxide sheet 823 is used to generate a differential analog voltage signal in combination with additional circuitry. The differential voltage signal is evaluated by the sigma-delta ADC 840. The humidity sensor element 830 includes a capacitive humidity sensor 831 that may comprise a dielectric material that changes its dielectric properties in dependence on capacity.

The capacitor 831 of sensor element 830 may be connected as capacitor CXP to terminal CXP1, CXP2 as shown in injection branch 202 of FIG. 3. The MOX gas sensor element 820 may be coupled to at least one of the terminals 411, 412 for a differential voltage signal of injection branch 204 of FIG. 4. The voltage signal derived from the MOX gas sensor element 820 may be forwarded to a circuit 824 to generate a differential voltage signal supplied to terminals 411, 412 of the injection branch 204. Circuit 824 may include a reference path including a resistor of fixed resistance and a measurement path including a variable resistor of metal oxide sheet 823. A fixed voltage may be forced on both resistors and the resulting currents through the resistors may be converted to a corresponding voltage using the base-emitter path of a respective diode to obtain a differential voltage. The sigma-delta ADC 840 is configured to operate in the capacitance dependent signal configuration of FIG. 3 in combination with the differential voltage divided by ΔVBE configuration of FIG. 4. Accordingly, sigma-delta ADC 840 generates digital output signals corresponding to the gas and humidity sensor elements 820, 830.

The multi-mode sensor 810 may be incorporated in a home automation device 850 that also includes a communication module 860. The communication module 860 transmits the digital signal obtained from sigma-delta ADC 840 over antenna 861 through a communication network. The sigma-delta ADC 840 allows the processing of analog input signals from two different sensor elements 820, 830 providing different input quantities, i.e., differential voltage from MOX sensor element 820 and capacitance dependent signal from humidity sensor 830. ADC 840 includes a reduced amount of components, requires less space and consumes less power so that it is specifically useful for the use in battery-powered home automation device 850.

It will be apparent to those skilled in the art that various modifications and variations can be made without departing from the spirit or scope of the disclosure as laid down in the appended claims. Since modifications, combinations, sub-combinations and variations of the disclosed embodiments incorporating the spirit and substance of the disclosure may occur to the persons skilled in the art, the disclosure should be construed to include everything within the scope of the appended claims.

The invention claimed is:

1. A sigma-delta analog-to-digital converter comprising:
a first injection branch and a second injection branch;
a first feedback branch and a second feedback branch;
an integration node connected to the first and second injection branches and the first and second feedback branches;
an integrator connected to the integration node; and
a comparator connected downstream of the integrator and configured to generate a comparator output signal to control the first and second feedback branches,
wherein the first and second injection branches are configured to provide a charge injection dependent on a respective input quantity to the integration node,
wherein an input quantity of the first injection branch is selected from a differential voltage signal, a capacitance dependent signal and a current dependent signal, wherein an input quantity of the second injection branch is selected from another one of the differential voltage signal, the capacitance dependent signal and the current dependent signal, and wherein the first and second feedback branches are configured to provide a feedback charge injection dependent on the comparator output signal to the integration node, the first and second feedback branches configured to receive one of a fixed voltage or the differential voltage signal.

2. The sigma-delta analog-to-digital converter according to claim 1, further comprising:

terminals for a differential input voltage, terminals for a fixed voltage and terminals to be connected to a capacitor of variable capacitance, wherein the first injection branch is configured to provide the charge injection dependent on the capacitance dependent signal and the second injection branch is configured to provide the charge injection dependent on the differential voltage signal, wherein the first injection branch is connected to the terminals to be connected to the capacitor of variable capacitance and connected to the terminals for the fixed voltage through respective switches, wherein the second injection branch comprises a capacitor connected to the terminals for the differential input voltage through respective switches, wherein the first feedback branch comprises a capacitor connected to the terminals for the fixed voltage through respective switches, and wherein the second feedback branch comprises a capacitor connected to the terminal for the differential voltage signal.

3. The sigma-delta analog-to-digital converter according to claim 2, wherein the second feedback branch further comprises a first current path and a second current path carrying alternating currents, each current path including a respective impedance element, the terminal for the differential voltage signal connected to one of the impedance elements.

4. The sigma-delta analog-to-digital converter according to claim 3, wherein the first and second current paths of the second feedback branch each includes a respective current source configured to supply a different current and a cross-switch arrangement to cross-connect the first and second current paths, and wherein the cross-switch arrangement is controlled in dependence on the comparator output signal.

5. The sigma-delta analog-to-digital converter according to claim 3, wherein the impedance elements of the first and second current paths each comprises a base-emitter path of a bipolar transistor.

6. The sigma-delta analog-to-digital converter according to claim 1, wherein the first and second injection branches each includes a first switch to connect a capacitor of the respective injection branch to the integration node and a second switch to connect the capacitor to a terminal for a common mode voltage, and wherein the first and second switches are configured to operate alternately.

7. The sigma-delta analog-to-digital converter according to claim 1, wherein the first and second feedback branches each includes a third switch configured to connect a capacitor of the respective feedback branch to the integration node and a fourth switch configured to connect the capacitor to a terminal for a common mode voltage, and wherein the third and fourth switches are configured to operate alternately.

8. The sigma-delta analog-to-digital converter according to claim 1, wherein the first injection branch includes a fifth switch configured to connect a capacitor of variable capacitance to one terminal for the fixed voltage and a sixth switch configured to connect the capacitor of variable capacitance to another terminal for the fixed voltage, and wherein the fifth and sixth switches are configured to operate alternately.

9. The sigma-delta analog-to-digital converter according to claim 1, wherein the second injection branch includes a seventh switch configured to connect a capacitor of a fixed capacitance to one terminal for the differential input voltage and an eighth switch configured to connect the capacitor of the fixed capacitance to another terminal for the differential input voltage, and wherein the seventh and eighth switches are configured to operate alternately.

10. The sigma-delta analog-to-digital converter according to claim 1, wherein the first and second injection branches and at least one of the first feedback branch or the second feedback branch are configured to convert the respective input quantities one after the other.

11. The sigma-delta analog-to-digital converter according to claim 1, wherein the input quantity of the first injection branch is the current dependent signal and the input quantity of the second injection branch is selected from the differential voltage signal or the capacitance dependent signal.

12. The sigma-delta analog-to-digital converter according to claim 1, further comprising another integrator connected downstream of the integrator.

13. The sigma-delta analog-to-digital converter according to claim 1, wherein the differential voltage signal to be received by the first and second feedback branches is a differential voltage in time multiplex.

14. The sigma-delta analog-to-digital converter according to claim 1, further comprising:

terminals for a differential input voltage and terminals for a fixed voltage, wherein one of the first injection branch or the second injection branch is configured to provide the charge injection dependent on the differential voltage signal, wherein the one of the first or second injection branch comprises a capacitor connected to the terminals for the differential input voltage through respective switches, and wherein the first feedback branch comprises a capacitor connected to the terminals for the fixed voltage through respective switches, the switches configured to operate alternately.

15. The sigma-delta analog-to-digital converter according to claim 1, further comprising:

a terminal for the current dependent signal and terminals for a fixed voltage, wherein one of the first injection branch or the second injection branch is configured to provide a charge injection dependent on the current dependent signal, and wherein the one of the first or second injection branch comprises a capacitor connected to the terminal for the current dependent signal, and wherein the first feedback branch comprises a capacitor connected to the terminals for the fixed voltage through respective switches, the switches configured to operate alternately.

16. A sensor arrangement comprising:

a sensor element configured to generate a voltage signal dependent on an ambient condition; and the sigma-delta analog-to-digital converter according to claim 1, wherein the sensor element is connected to the sigma-delta analog-to-digital converter, wherein the sensor element comprises a metal oxide element disposed on a heater, and wherein the metal oxide element is coupled to a terminal for a differential input voltage of one of the first injection branch or the second injection branch.

17. A home automation device comprising:

a communication module; and the sensor arrangement according to claim 16, wherein the communication module is configured to transmit information in response to a signal generated by the sensor arrangement.

18. A multi-mode sensor arrangement comprising:

a first sensor element and a second sensor element configured to be responsive to different ambient conditions; and the sigma-delta analog-to-digital converter according to claim 2, wherein the first sensor element comprises a gas sensitive metal oxide sensor element coupled to one of the terminals for the differential input voltage of the second injection branch, and wherein the second sensor element comprises a humidity sensor element comprising a capacitor including a dielectric sensitive to ambient humidity, the capacitor connected to the terminals for the capacitor of variable capacitance of the first injection branch.

19. A home automation device comprising:

a communication module; and the multi-mode sensor arrangement according to claim 18, wherein the communication module is configured to transmit information in response to a signal generated by the multi-mode sensor arrangement.

* * * * *